United States Patent [19]

Fisher

[11] Patent Number: 5,644,242

[45] Date of Patent: Jul. 1, 1997

[54] ARMATURE WINDING AND WINDING CONNECTION TEST METHODS

[76] Inventor: James Allan Fisher, 1312 Devereux Dr., Dayton, Ohio 45419

[21] Appl. No.: 493,165

[22] Filed: Jun. 21, 1995

[51] Int. Cl.$^6$ .............................. G01R 31/34; G01R 31/06
[52] U.S. Cl. .......................... 324/545; 324/546; 324/713; 324/772; 340/648
[58] Field of Search ................................ 324/545, 546, 324/713, 715, 772; 340/648

[56] References Cited

U.S. PATENT DOCUMENTS

| | | | |
|---|---|---|---|
| 2,890,407 | 6/1959 | Huehn et al. | 324/545 |
| 3,270,277 | 8/1966 | Ward | 324/545 |
| 3,590,373 | 6/1971 | Lake | 324/691 |
| 3,746,979 | 7/1973 | Kildishev et al. | 324/545 |
| 3,896,376 | 7/1975 | Sinniger | 324/772 |
| 4,053,830 | 10/1977 | Porter | 324/545 |
| 4,651,086 | 3/1987 | Domenichini et al. | 324/715 |
| 4,766,387 | 8/1988 | Browne et al. | 324/545 |
| 4,864,242 | 9/1989 | Hurley | 324/510 |
| 5,115,200 | 5/1992 | Lahitte et al. | 324/718 |
| 5,136,252 | 8/1992 | Witt | 324/715 |
| 5,140,276 | 8/1992 | Fisher | 324/713 |
| 5,218,860 | 6/1993 | Storar | 73/116 |
| 5,256,977 | 10/1993 | Domenichini et al. | 324/546 |
| 5,307,019 | 4/1994 | Robey et al. | 324/713 |
| 5,311,121 | 5/1994 | Kawamura | 324/158 |
| 5,457,402 | 10/1995 | Sato | 324/772 |
| 5,550,477 | 8/1996 | Domenichini et al. | 324/545 |

*Primary Examiner*—Kenneth A. Weder
*Assistant Examiner*—Glenn W. Brown
*Attorney, Agent, or Firm*—Killworth, Gottman, Hagan & Schaeff, LLP

[57] ABSTRACT

A single source of energy is used to determine up to four armature coil or winding resistances and effectively up to four armature winding weld resistances for each test connection or index position of an armature being tested to thereby reduce the test time required for testing commutated armatures while reducing the complexity of the apparatus and test methods applied. Two preferably substantially diametrically opposite driven current paths through the armature windings are driven, and current and voltage measurements are taken at various commutator bars including commutator bars located adjacent current input ends and current output ends of the driven current paths. The resulting measurements and computations using these measurements are used to determine the winding resistances and ultimately the winding weld resistances for armatures and, in particular, for testing armatures for compliance with required specifications. By taking measurements at both ends of the driven current paths, the number of measurements which can be taken at a time or during a given connection pattern to an armature is doubled such that the time is also substantially halved.

14 Claims, 3 Drawing Sheets

ARMATURE WINDING AND WINDING CONNECTION TEST METHODS

BACKGROUND OF THE INVENTION

The present invention relates in general to testing electric motor components and, more particularly, to methods for determining multiple winding or coil resistances and multiple coil connection or weld resistances within armatures used in electric motors.

Many electric motors and generators utilize armatures having a plurality of windings or coils which are connected in series to one another. The ends of the coils are connected to commutator bars such that each connection between two coils is connected to a commutator bar. The commutator bars are brought in and out of contact with brush type contacts to intermittently connect the coils to an electric power source for a motor or the electrical load for a generator.

The connections between the coils and the commutator bars are commonly formed by welds or solder joints. Since reliable welds are very low in resistance compared to the resistance of the coils of an armature, testing armatures through the commutator bars is challenging. For example, in a typical appliance motor, the resistance across a pair of commutator bars is in the order of 200 milliohms ±≈5%, ≈10 milliohms, whereas the maximum permissible contact resistance is approximately 0.1% of that amount, or about 0.2 milliohms. With such great differences between the resistance of a coil and the resistances of the connections or welds which connect it to its commutator bars, the direct measurement of the resistance between two commutator bars can not be used to detect a defective connection.

A number of testing arrangements are available to overcome these difficulties and permit accurate testing of armatures through the commutator bars. One example, U.S. Pat. No. 5,140,276, discloses an arrangement for testing the resistances of armature commutator connections and the resistances of individual coils of an armature. Two independent constant current sources having identical output currents are connected across opposite pairs of armature windings through their respective commutator bars.

The current sources are connected in opposite polarity to minimize circulating current in other windings of the armature. The voltages across windings adjacent to the two windings are combined and are a function of the combination of the resistances of two of the connections of the windings and the commutator bars. The voltages across each constant current source is representative of the resistances of the windings to which the sources are connected. Unfortunately, only combinations of two connection resistances can be determined with this arrangement and only one such combination for each measurement. The arrangement is also limited to the determination of two winding resistances at one time.

Another example, U.S. Pat. No. 5,307,019, discloses an arrangement wherein first electric stimuli are applied to pairs of commutator bars to measure the response at other pairs of commutator bars and thereby determine the resistance ratios between the coils of the other pairs of commutator bars. Second stimuli are then applied and response voltages measured between some other pairs of commutator bars to determine weld resistances based on the previously determined coil resistance ratios. Unfortunately, this repetitive two step arrangement requires repeated connections to an armature or relatively complicated control of a multiple connection jig or fixture for testing the armature.

There is an ongoing need for improved test arrangements for commutated armatures which serve not only to expand the art but also to simplify the testing of armature windings or coils and associated connections of the coils to commutator bars. Preferably such arrangements require less circuitry while testing armatures more quickly than prior art arrangements.

SUMMARY OF THE INVENTION

This need is currently met by the methods of the present invention wherein a single source of energy is used to determine up to four armature coil or winding resistances and effectively up to four armature weld resistances at a time to thereby reduce the test time required for testing commutated armatures while reducing the complexity of the apparatus and test methods applied. The present invention drives two preferably substantially diametrically opposite driven current paths through the armature windings and takes current and voltage measurements at various commutator bars including commutator bars located adjacent current input ends and current output ends of the driven current paths. By taking measurements at both ends of the driven current paths, the number of measurements which can be taken at a time or during a given connection pattern to an armature is doubled such that the time is also substantially halved.

In accordance with one aspect of the present invention, a method of testing an armature including a plurality of series connected windings each of the plurality of windings being connected to a pair of commutator bars through resistive connections comprises the steps of: connecting a source of electrical energy across first and second commutator bars to form a first driven current path through at least one winding connected between the first and second commutator bars, the first driven current path receiving current at the first commutator bar and emitting current from the second commutator bar; connecting the source of electrical energy across third and fourth commutator bars to form a second driven current path through at least one winding connected between the third and fourth commutator bars, the second driven current path receiving current at the third commutator bar and emitting current from the fourth commutator bar, the first and second driven current paths being connected to conduct current in opposite directions around the plurality of series connected windings and being separated from one another by at least three windings; determining current flowing in the first driven current path; determining current flowing in the second driven current path; measuring voltage across at least one pair of commutator bars connected to the at least one winding within the first driven current path and including the first and second commutator bars; measuring voltage across at least one pair of commutator bars connected to the at least one winding within the second driven current path and including the third and fourth commutator bars; determining resistance of the at least one winding connected between the at least one pair of commutator bars within the first driven current path by combining the voltage measured thereacross with the current determined to be flowing in the first driven current path; and, determining resistance of the at least one winding connected between the at least one pair of commutator bars within the second driven current path by combining the voltage measured thereacross with the current determined to be flowing in the second driven current path.

Preferably, for armatures having a sufficient number of windings the step of connecting a source of electrical energy across first and second commutator bars to form a first driven current path through at least one winding connected between the first and second commutator bars comprises the step of connecting the source of electrical energy across first and second commutator bars to form a first driven current path through two or more windings connected between the first and second commutator bars; the step of connecting the source of electrical energy across third and fourth commutator bars to form a second driven current path through at least one winding connected between the third and fourth commutator bars comprises the step of connecting the source of electrical energy across the third and fourth commutator bars to form a second driven current path through two or more windings connected between the third and fourth commutator bars; the step of measuring voltage across at least one pair of commutator bars connected to the at least one winding within the first driven current path comprises the step of measuring voltages across two pairs of commutator bars within the first driven current path and including the first and second commutator bars; the step of measuring voltage across at least one pair of commutator bars connected to the at least one winding within the second driven current path comprises the step of measuring voltages across two pairs of commutator bars within the second driven current path and including the third and fourth commutator bars; the step of determining resistance of the at least one winding connected between the at least one pair of commutator bars within the first driven current path comprises the step of determining resistances of windings connected between the two pairs of commutator bars within the first driven current path by combining the voltages measured thereacross with the current determined to be flowing in the first driven current path; and, the step of determining resistance of the at least one winding connected between the at least one pair of commutator bars within the second driven current path comprises the step of determining resistances of windings connected between the two pairs of commutator bars within the second driven current path by combining the voltages measured thereacross with the current determined to be flowing in the second driven current path.

For best operation, the first and second driven current paths are substantially diametrically opposite to one another on the armature. The step of determining current flowing in the first driven current path may comprise the steps of: measuring current flowing into the first commutator bar; measuring current flowing out of the second commutator bar; measuring a first voltage across a first intermediate winding connected between an adjacent pair of commutator bars between the first commutator bar and the third commutator bar but not including either the first commutator bar or the third commutator bar; measuring a second voltage across a second intermediate winding connected between an adjacent pair of commutator bars between the second commutator bar and the fourth commutator bar but not including either the second commutator bar or the fourth commutator bar; calculating an estimated resistance value for the first and second intermediate windings by combining the first and second voltages with the current flowing into the first commutator bar and the current flowing out of the second commutator bar; determining current flowing through the first intermediate winding by combining the estimated resistance value with the first voltage; and, combining the current flowing into the first commutator bar with the current flowing through the first intermediate winding.

The step of determining current flowing in the second driven current path may comprise the steps of measuring current flowing into the third commutator bar; and, combining the current flowing into the third commutator bar with the current flowing through the first intermediate winding. The method may further comprise the step of indexing the connections of the source of electrical energy around the commutator bars of the armature to determine resistances for all of the plurality of series connected windings. For weld resistance determinations, the method may further comprise the step of measuring voltages across windings adjacent and connected to the first, second, third and fourth commutator bars but outside of the first and second driven current paths. For this determination, the method further comprises the steps of: indexing the connections of the source of electrical energy around the commutator bars of the armature to determine resistances for all of the plurality of series connected windings, currents and voltages for each of the connections of the source of electrical energy; and, combining the voltages measured across windings adjacent and connected to the first, second, third and fourth commutator bars but outside of the first and second driven current paths for each index with resistances for the windings and currents flowing during each index to determine resistances of the welds or resistive connections of the plurality of windings to the commutator bars.

The step of combining the voltages measured across windings adjacent and connected to the first, second, third and fourth commutator bars but outside of the first and second driven current paths for each index with resistances for the windings and currents flowing during each index may comprise for each commutator bar the steps of: multiplying the current flowing through an adjacent intermediate winding times the winding resistance of the winding adjacent and connected to the commutator bar but outside of the driven current path associated with the commutator bar to obtain a voltage product; combining the voltage measured across the winding adjacent and connected to the commutator bar but outside of the driven current path associated with the commutator bar with the voltage product to obtain voltage across the resistive connection to the commutator bar; and, dividing the voltage across the resistive connection to the commutator bar by the current flowing into or out of the commutator bar.

In accordance with another aspect of the present invention, a method of testing an armature including a plurality of series connected windings each of the plurality of windings being connected to a pair of commutator bars through resistive connections comprises the steps of: connecting a source of electrical energy across first and second commutator bars to form a first driven current path through at least one winding connected between the first and second commutator bars, the first driven current path receiving current at the first commutator bar and emitting current from the second commutator bar; connecting the source of electrical energy across third and fourth commutator bars to form a second driven current path through at least one winding connected between the third and fourth commutator bars, the second driven current path receiving current at the third commutator bar and emitting current from the fourth commutator bar, the first and second driven current paths being connected to conduct current in opposite directions around the plurality of series connected windings and being separated from one another by at least three windings; measuring current flowing into the third commutator bar; measuring current flowing out of the fourth commutator bar; measuring a first voltage across first intermediate winding connected between an adjacent pair of commutator bars between the first commutator bar and the third commutator bar but not including either the first commutator bar or the third commutator bar; measuring a second voltage across a second intermediate winding connected between an adjacent pair of commutator bars between the second commutator bar and the fourth commutator bar but not including either the second commutator bar or the fourth commutator bar; calculating an estimated resistance value for the first and second intermediate windings by combining the first and second voltages with the current flowing into the third commutator bar and the current flowing out of the fourth commutator bar; determining current flowing through the first intermediate winding by combining the estimated resistance value with the first voltage; determining current flowing in the second driven current path by combining the current flowing into the third commutator bar with the current flowing through the first intermediate winding; measuring current flowing into the first commutator bar; determining current flowing in the first driven current path by combining the current flowing into the first commutator bar with the current flowing through the first intermediate winding; measuring voltage across at least one pair of commutator bars within the first driven current path and including the first and second commutator bars; measuring voltage across at least one pair of commutator bars within the second driven current path and including the third and fourth commutator bars; determining resistance of at least one winding connected between the at least one pair of commutator bars within the first driven current path by combining the voltages measured thereacross with the current determined to be flowing in the first driven current path; and, determining resistance of at least one winding connected between the at least one pair of commutator bars within the second driven current path by combining the voltages measured thereacross with the current determined to be flowing in the second driven current path.

Preferably, for armatures having a sufficient number of windings, the step of connecting a source of electrical energy across first and second commutator bars to form a first driven current path through at least one winding connected between the first and second commutator bars comprises the step of connecting the source of electrical energy across the first and second commutator bars to form a first driven current path through two or more windings connected between the first and second commutator bars; the step of connecting the source of electrical energy across third and fourth commutator bars to form a second driven current path through at least one winding connected between the third and fourth commutator bars comprises the step of connecting the source of electrical energy across the third and fourth commutator bars to form a second driven current path through two or more windings connected between the third and fourth commutator bars; the step of measuring voltage across at least one pair of commutator bars connected to the at least one winding within the first driven current path comprises the step of measuring voltages across two pairs of commutator bars within the first driven current path and including the first and second commutator bars; the step of measuring voltage across at least one pair of commutator bars connected to the at least one winding within the second driven current path comprises the step of measuring voltages across two pairs of commutator bars within the second driven current path and including the third and fourth commutator bars; the step of determining resistance of the at least one winding connected between the at least one pair of commutator bars within the first driven current path comprises the step of determining resistances of windings connected between the two pairs of commutator bars within the first driven current path by combining the voltages measured thereacross with the current determined to be flowing in the first driven current path; and, the step of determining resistance of the at least one winding connected between the at least one pair of commutator bars within the second driven current path comprises the step of determining resistances of windings connected between the two pairs of commutator bars within the second driven current path by combining the voltages measured thereacross with the current determined to be flowing in the second driven current path.

In accordance with yet another aspect of the present invention, a method of testing an armature including a plurality of series connected windings each of the plurality of windings being connected to a pair of commutator bars through resistive connections comprises the steps of: connecting a first source of constant current across first and second commutator bars to form a first driven current path through one or more windings connected between the first and second commutator bars, the first driven current path having a current input end and a current output end; connecting a second source of constant current across third and fourth commutator bars to form a second driven current path through one or more windings connected between the third and fourth commutator bars, the second driven current path having a current input end and a current output end; the first and second driven current paths being connected to conduct current in opposite directions around the plurality of series connected windings and being separated from one another by at least two windings, the first and second sources of constant current being approximately equal in output current and independent of one another; measuring a first voltage across a pair of commutator bars adjacent to the input end of the first driven current path; measuring a second voltage across a pair of commutator bars adjacent to the output end of the second driven current path; measuring a third voltage across a pair of commutator bars adjacent to the input end of the second driven current path; measuring a fourth voltage across a pair of commutator bars adjacent to the output end of the first driven current path; determining the combined resistance of the resistive connections of the first current source to the input end of the first current path and the second current source to the output end of the second current path by combining the first and second voltages; and, determining the combined resistance of the resistive connections of the second current source to the input end of the second current path and the first current source to the output end of the first current path by combining the third and fourth voltages.

For this aspect of the invention, wherein the first and second current paths comprise at least a first winding adjacent the input ends and a last winding adjacent the output ends, the method may further comprise the steps of: measuring a fifth voltage across a first winding in the first driven current path; measuring a sixth voltage across a first winding in the second driven current path; measuring a seventh voltage across a last winding in the first driven current path; measuring an eighth voltage across a last winding in the second driven current path; determining resistance of the first winding in the first driven path from the fifth voltage; determining resistance of the first winding in the second driven path from the sixth voltage; determining resistance of the last winding in the first driven path from the seventh voltage; and, determining resistance of the last winding in the second driven path from the eighth voltage.

It is, thus, an object of the present invention to provide an improved armature testing arrangement wherein up to four winding resistances and effectively up to four weld resistances can be determined at a time; to provide an improved armature testing arrangement wherein up to four winding resistances and effectively up to four weld resistances can be determined at a time which requires only a single source of power; and, to provide an improved armature testing arrangement wherein up to four winding resistances and effectively up to four weld resistances can be determined at a time utilizing a pair of independent current sources.

Other objects and advantages of the invention will be apparent from the following description, the accompanying drawings and the appended claims.

BRIEF DESCRIPTION OF THE INVENTION

DETAILED DESCRIPTION OF THE INVENTION

Figure 1:
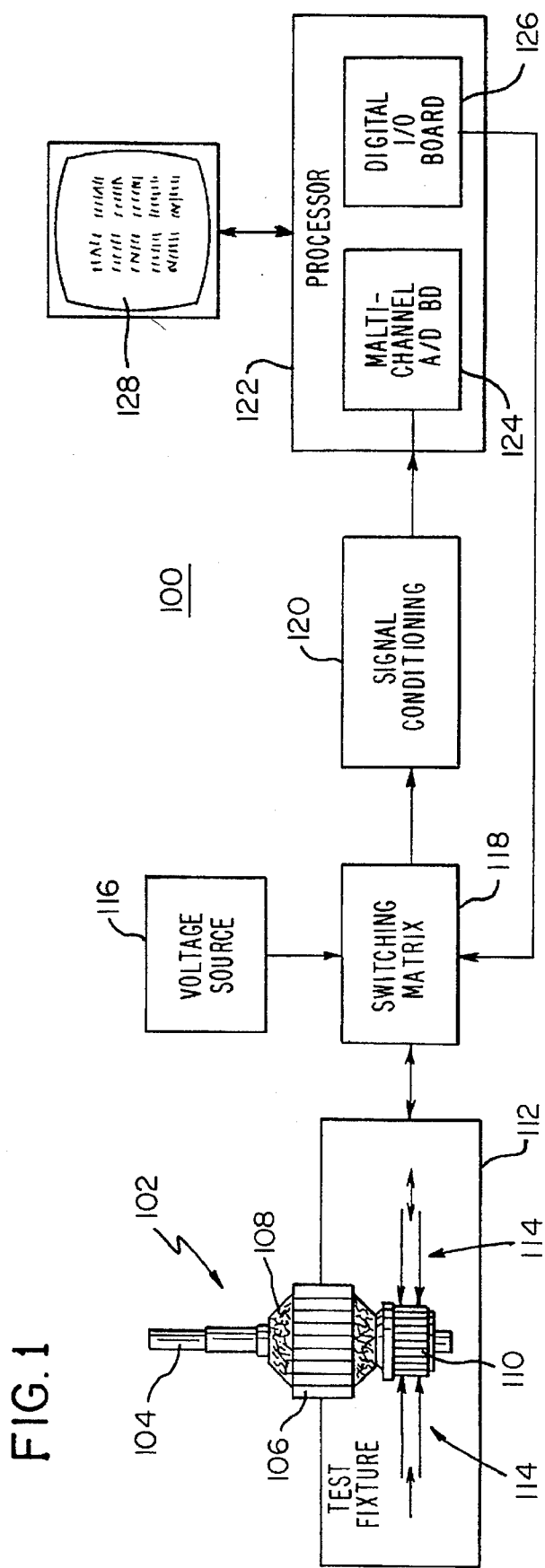
FIG. 1 is a high level block diagram illustrating a system or apparatus for testing windings and winding connections in accordance with the present invention.

The invention will now be described with reference to the drawing figures wherein FIG. 1 illustrates, in block diagram form, a system 100 for testing armature coils or windings and the connections of the windings to commutator bars of the armatures.

As shown in FIG. 1, a typical motor armature 102 includes a shaft 104 to which is mounted an armature stack 106 containing a plurality of armature windings 108. The armature windings 108 are connected in series to one another with the ends of the windings 108 being connected to commutator bars 110 by welds such that each connection between two of the windings 108 is connected to one of the commutator bars 110. The commutator bars 110 are brought in and out of contact with brush type contacts to make intermittent connections to the windings 108 of the armature 102.

Armatures, such as the armature 102, are connected into the system 100, for testing purposes, by a test fixture 112. In the illustrated test fixture 112, each of the commutator bars 110 is engaged by a pair of retractable pins 114 after the armature 102 is positioned within the test fixture 112. The pairs of retractable pins 114 make Kelvin or four-wire connections with the commutator bars 110 to improve the accuracy of measurements made on the windings 108 of the armature 102 through the commutator bars 110.

While all of the commutator bars 110 are simultaneously engaged by the pairs of retractable pins 114, the connections of a single source of energy, a voltage source 116 as illustrated, and the resulting voltages generated across selected pairs of the commutator bars 110 are performed by a switching matrix 118. It is noted that a variety of energy sources including voltage sources and current sources can be used in the present invention.

The voltage source 116 is connected to two pairs of the commutator bars 110 as will be fully described and voltages generated in response to the connections of the voltage source 116 to the armature 102 are selectively connected to signal conditioning circuitry 120 by the switching matrix 118. The signal conditioning circuitry 120 comprises operational amplifiers connected to properly scale and filter the voltages generated on the selected pairs of the commutator bars 110 in accordance with conventional operational amplifier design.

While the illustrated test fixture 112 is arranged to connect to all of the commutator bars 110 of the armature 102, it is noted that other fixtures and connection arrangements can be utilized in the present invention. For example, it is possible to provide a test fixture which connects only to selected ones of the commutator bars 110 with armatures being turned to index the connections and thereby test all windings and winding welds of the armatures. Such limited connection test fixtures might be provided for armatures which have a very large number of commutator bars. While testing using limited connection test fixtures takes more time, typically the armatures using such fixtures require more time to manufacture and hence their production can more easily tolerate the extended test times. In addition, smaller numbers of such armatures are made.

The system 100 is controlled by a processor 122 which takes the form of an industrial grade 486 personal computer in a working embodiment of the invention. Signals from the signal conditioning circuitry 120 are received through a multi-channel analog-to-digital (A/D) circuit board 124 with control of the switching matrix 118 being performed by the processor 122 via a digital input/output (I/O) circuit board 126. Appropriate A/D and I/O circuit boards 124, 126 are commercially available from a number of sources. As illustrated, results generated by the processor 122 of the system 100 are displayed on a monitor 128 either as numerical data or as graphic displays. Of course, other forms of communication of the system 100 with an operator of the system 100 are possible such as light displays and sounders as well as others.

The system 100 operates to determine individual weld resistances rather than combinations of weld resistances and requires only a single power supply. In addition, for armatures having around 12 or more commutator bars, for each test connection or index position of an armature being tested the system 100 can be configured to measure four winding resistances and effectively four weld resistances since measurements and computations later used to determine weld resistances are taken for each test connection. Such operation substantially speeds up armature testing operations. This is important not only for the obvious improvement in speed of testing but also because improved testing speed may permit the elimination of one or more test fixtures which add expense to a testing facility. As will be apparent from the following, while up to four winding and effectively four weld resistances can be measured for armatures having less that 12 commutator bars, the overlap and multiple measurements performed to completely test such armatures detracts from the advantages of the present invention.

Figure 2:
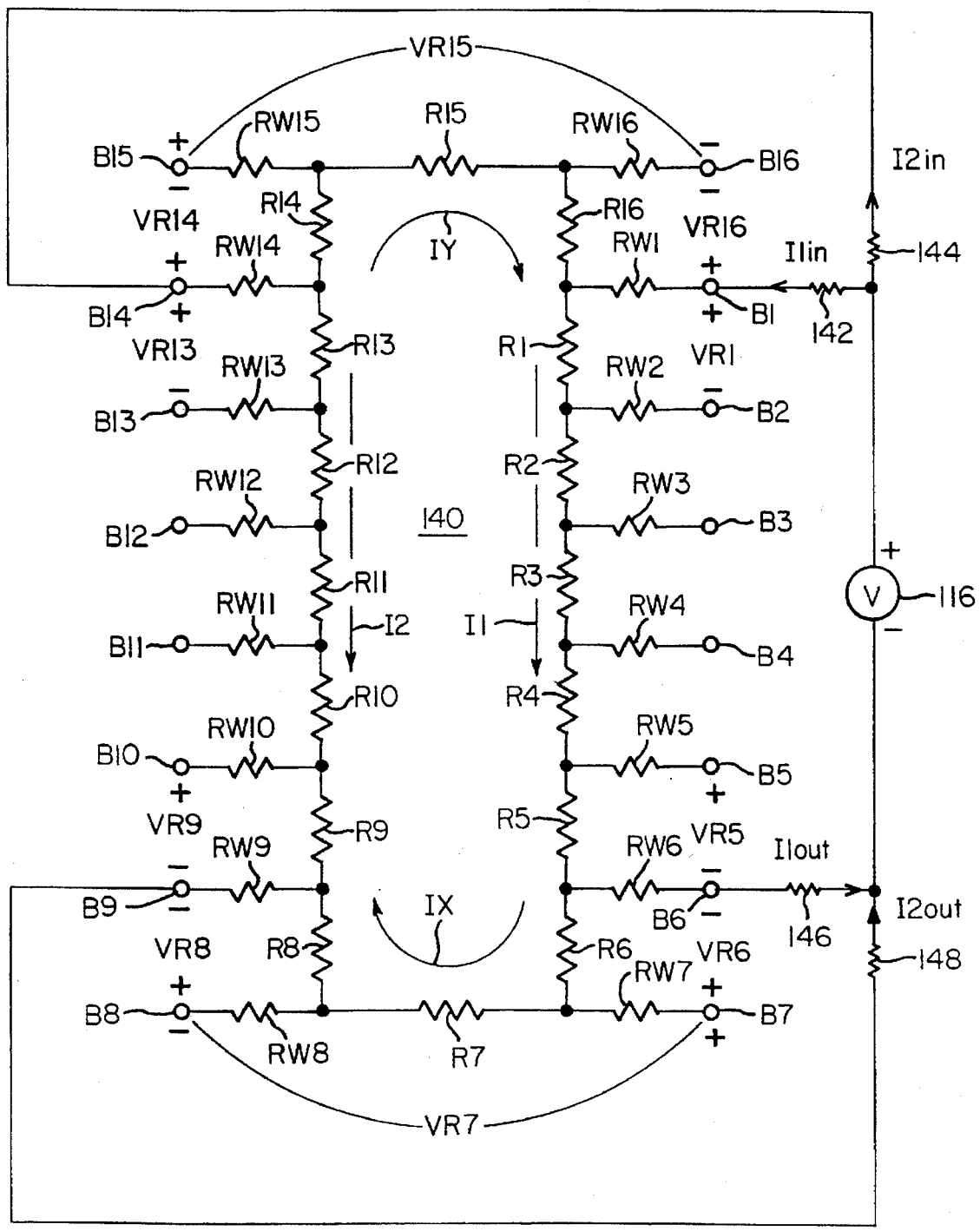
FIG. 2 is a schematic diagram showing an illustrative set of connections to an armature being tested in the system of FIG. 1.

Referring now to FIG. 2, a sixteen winding/sixteen commutator bar armature 140 is illustrated in electrical schematic diagram form. The sixteen windings of the armature 140 are represented by the corresponding resistance values R1–R16 of the windings. As can be seen, the windings R1–R16 are connected in series with one another with the connections between each two windings R1–R16 being brought out to commutator bars B1–B16. The connections of the windings R1–R16 to the commutator bars B1–B16 are represented by the weld resistances RW1–RW16.

The voltage source 116 is connected across first and second commutator bars to form a first driven current path which includes a first set of at least one winding connected between the first and second commutator bars. In FIG. 2, the voltage source 116 is connected across first and second commutator bars B1, B6 to form the first driven current path through the windings R1–R5 which are connected between the first and second commutator bars B1, B6. The first driven current path receives current via a current input end at the commutator bar B1 and emits current via a current output end at the commutator bar B6.

The voltage source 116 is also connected across third and fourth commutator bars to form a second driven current path which includes a second set of at least one winding connected between the third and fourth commutator bars. In FIG. 2, the voltage source 116 is connected across third and fourth commutator bars B14, B9 to form the second driven current path through the windings R13–R9 which are connected between the third and fourth commutator bars B14, B9. The second driven current path receives current via a current input end at the commutator bar B14 and emits current via a current output end at the commutator bar B9.

As can be seen from FIG. 2, the first and second driven current paths are connected to conduct current in opposite directions around the plurality of series connected windings R1–R16 such that circulating currents in the windings which are not included in the driven current paths are held to a low level. The first and second driven current paths are separated from one another by at least three windings with exactly three windings being illustrated in FIG. 2. The first and second driven current paths preferably are positioned substantially diametrically opposite to one another on the armature 102.

Current I1 in the first driven current path and current I2 in the second driven current path are determined as will be described. The currents I1, I2 in the first and second driven current paths are approximately equal to one another and are connected to generate approximately equal and opposing voltages in the series connected loop of the windings R1–R16.

In an ideal world or if the voltages across the first and second driven current paths are controlled properly, there would be no current flowing in the windings which are not included in the first and second driven current paths. However, this is not the case and there are small circulating currents which flow in windings outside the first and second driven current paths. Thus, circulating current IY is shown as flowing through R14–R16 and circulating current IX is shown as flowing through windings R6–R8.

While the circulating currents IX and IY are indicated as flowing in the directions of increasing winding number, the direction of current flow depends upon the armature which is connected at the time and the specific connections to the armature. This is because windings on an armature are never exactly equal in resistance to one another and the weld resistances also vary from weld to weld.

For the present invention, the voltages VR1 and VR5, across two pairs of commutator bars B1–B2, B5–B6 within the first driven current path and including the first and second commutator bars B1 and B6, and the voltages VR13 and VR9 across two pairs of commutator bars B14–B13, B10–B9 within the second driven current path and including the third and fourth commutator bars B14 and B9, are measured. The resistances of the windings R1 and R5 connected between the two pairs of commutator bars B1–B2, B5–B6 are determined by combining the voltages VR1 and VR5 measured thereacross with the current I1 determined to be flowing in the first driven current path using the equations:

$$R1=VR1/I1 \text{ and } R5=VR5/I1;$$

and,
the resistances of the windings R13 and R9 connected between the two pairs of commutator bars B14–B13, B10–B9 are determined by combining the voltages VR13 and VR9 measured thereacross with the current I2 determined to be flowing in the second driven current path using the equations:

$$R13=VR13/I2 \text{ and } R9=VR9/I2.$$

For each test connection or index position of the voltage source 116 to the commutator bars B1–B16, a number of measurements are taken via the commutator bars B1–B16 with these measurements being used to determine the winding resistances R1–R16 and the weld resistances RW1–RW16 as will be fully described herein. The measurements which are taken for each connection or index of the voltage source 116 are as follows.

As noted before, the voltages VR1, VR5, VR13 and VR9 are measured.

Currents $I1_{in}$ and $I2_{in}$ flowing into the first and third commutator bars B1, B14, respectively, are measured, for example by measuring the voltages across first and second precision shunt resistances 142, 144.

Currents $I1_{out}$ and $I2_{out}$ flowing out of the second and fourth commutator bars B6, B9, respectively, are measured, for example by measuring the voltages across third and fourth precision shunt resistances 146, 148.

A first voltage VR15, across a first intermediate winding R15 connected between an adjacent pair of commutator bars B15, B16 between the first commutator bar B1 and the third commutator bar B14 but not including either the first commutator bar B1 or the third commutator bar B14, is measured. A second voltage VR7, across a second intermediate winding R7 connected between an adjacent pair of commutator bars B7, B8 between the second commutator bar B6 and the fourth commutator bar B9 but not including either the second commutator bar B6 or the fourth commutator bar B9, is measured. Voltages VR16, VR6, VR14, VR8 across windings R16, R6, R14, R8 adjacent and connected to the first, second, third and fourth commutator bars B1, B6, B14, B9 but outside of the first and second driven current paths, are measured.

The following equations can be derived from the circuit of FIG. 2:

$$I1=I1_{in}+IY=I1_{out}+IX \rightarrow I1_{out}-I1_{in}=IY-IX$$

$$I2=I2_{in}-IY=I2_{out}-IX \rightarrow I2_{in}-I2_{out}=IY-IX$$

To determine I1 and I2 from these equations, IX and IY is first determined as will now be described. Since there is no current flow through RW15, RW16, RW7 or RW8:

$$IY=VR15/R15 \text{ and } IX=VR7/R7 \rightarrow IY-IX=VR15/R15-VR7/R7$$

Since R7 and R15 are opposite coils on the armature 140 and accordingly are very close in resistance to one another, it is presumed that they are equal to one another, i.e., R7 ≈R15 ≈RA, such that:

$$IY-IX=(VR15-VR7)/RA \rightarrow RA=(VR15-VR7)/(IY-IX)$$

$$RA=(VR15-VR7)/(I1_{out}31\ I1_{in})=(VR15-VR7)/(I2_{in}-I2_{out})$$

$$IY=VR15/RA \text{ and } IX=VR7/RA$$

Since IX and IY are <<I1 and I2, very little accuracy is lost due to this approximation.

With IY and IX determined, the four winding resistances R1, R5, R13 and R9 can now be determined from the equations:

$$R1=VR1;\ R5=VR5/I1;\ R13=VR13/I2;\ \text{and,}\ R9=VR9/I2$$

From the forgoing description, it is apparent that up to four winding resistances can be determined at the same time, i.e., during the same test connection or index position. As illustrated in FIG. 1, the processor 122 of the system 100 then indexes the connections via the switching matrix 118 around the armature 102 until all winding resistances have been determined. Alternately, if a different electrical connection arrangement is provided for connecting to the commutator bars 110, an armature under test may be turned for indexing purposes as earlier noted. For each test connection or index position, in addition to the winding resistances determined, measurements and computed values are also recorded for the computation of the weld resistances RW1–RW16. The measurements and computed values correspond to the following using the designations of the test connection or index position of the armature of FIG. 2: $I1_{in}$; $I1_{out}$; $I2_{in}$; $I2_{out}$; IY; IX; VR6; VR8; VR14; and, VR16. Of course, as should be apparent, the actual measurements and calculations correspond to different winding resistances and are coordinated by the processor 122 as an armature is moved to different index positions to completely test it.

After the above described measurements and computations have been performed for the various test connections or index positions, all winding resistances R1–R16 are known and all additional data necessary for determining the weld resistances RW1–RW16 are known. This data includes: the currents $I1_{in}$, $I2_{in}$ flowing into the first and third commutator bars B1, B14, respectively, and the currents $I1_{out}$, $I2_{out}$ flowing out of the second and fourth commutator bars B2, B9, respectively; the voltages VR16, VR6, VR14, VR8, across the windings R16, R6, R14, R8 adjacent and connected to the first, second, third and fourth commutator bars B1, B6, B14, B9 but outside of the first and second driven current paths; and, the currents IX and IY. The determination of the weld resistances RW1, RW6, RW9 and RW14 are then determined from the following equations.

$$VR16 = I1_{in}(RW1) - IY(R16) \rightarrow RW1 = (VR16 + IY(R16))/I1_{in}$$

$$VR4 = I1_{out}(RW6) - IX(R6) \rightarrow VR4 + IX(R6))/I1_{out}$$

$$VR8 = I2_{out}(RW9) + IX(R8) \rightarrow RW9 = (VR8 - IX(R8))/I2_{out}$$

$$VR14 = I2_{in}(RW14) + IY(R14 = (VR14 - IY(R14))/I2_{in}$$

The remaining weld resistances are computed using these same equations and the values stored as the test connections or index positions were indexed around the armature 140.

From the forgoing description, it is apparent that up to four winding resistances and effectively four weld resistances can be determined at the same time, i.e., by measurements and computations made during the same test connection or index position. As illustrated in FIG. 1, the processor 122 of the system 100 then indexes the connections via the switching matrix 118 around the armature 102 until all winding resistances have been measured. Alternately, if a different electrical connection arrangement is provided for connecting to the commutator bars 110, an armature under test may be turned for indexing purposes as earlier noted. The winding resistances R1–R16 can then be combined with other measured and computed values as described above to determine the weld resistances.

The teachings of the present application can also be applied to prior art winding and winding weld testing arrangements such as those disclosed in U.S. Pat. No. 4,651,086, U.S. Pat. No. 5,140,276 and U.S. Pat. No. 5,307,019. In particular, prior art testing arrangements can be expanded to measure resistances at both the input end of power application to one or more windings and also at the output end of power application. To better illustrate this expansion in accordance with the present invention, application of the present invention to U.S. Pat. No. 5,140,276, which issued to Fisher on Aug. 18, 1992 and is incorporated herein by reference, will now be described.

Figure 3:
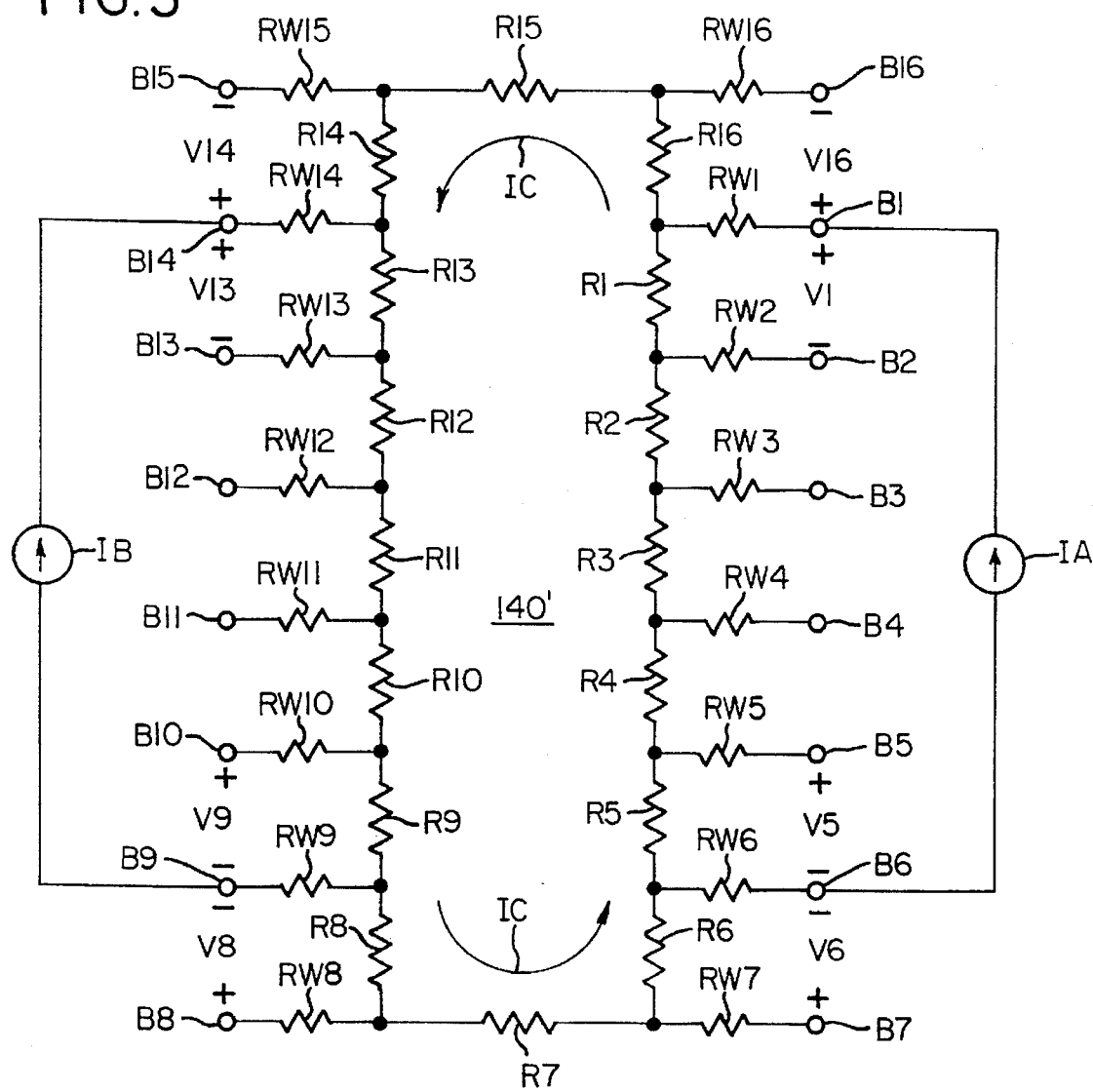
FIG. 3 is a schematic diagram showing an alternate embodiment of an arrangement for testing winding and winding connections in accordance with the present invention.

Referring now to FIG. 3, a sixteen winding/sixteen commutator bar armature 140' is illustrated in electrical schematic diagram form. Since the armature 140' is substantially identical to the armature 140 of FIG. 2, the same designations have been applied such that the sixteen windings of the armature 140' are represented by the windings R1–R16, the weld resistances are represented by the weld resistances RW1–RW16 and the commutator bars are represented by the commutator bars B1–B16. A first source of constant current IA is connected across first and second commutator bars B1, B6 to form a first driven current path through the windings R1–R5 connected between the first and second commutator bars B1, B6. The first driven current path has a current input end at the commutator bar B1 and a current output end at the commutator bar B6.

A second source of constant current IB is connected across third and fourth commutator bars B14, B9 to form a second driven current path through the windings R13–R9 connected between the third and fourth commutator bars B14, B9. The second driven current path has a current input end at the commutator bar B14 and a current output end at the commutator bar B9. The first and second driven current paths are connected to conduct current in opposite directions around the plurality of series connected windings R1–R16 and are separated from one another by at least two windings. The first and second sources of constant current IA and IB are approximately equal in output current and are independent of one another.

The powering arrangement as shown in FIG. 3 including two independent constant current sources IA and IB results in circulating currents IC in the windings which are not included in the first and second driven current paths. The circulating currents IC in both the upper and lower portions of the schematic diagram of FIG. 3 are substantially the same because the constant current sources IA and IB are independent of one another and are approximately equal in output current. The sum of the weld resistance at the input end of the first driven current path and the weld resistance at the output end of the second driven current path are determined substantially as in Fisher by noting that IA is substantially equal to IB such that IA=IB=I and applying the equation RW1+RW9=(V16+V8)/I after taking the appropriate measurements of the voltages, the currents should not need to be measured since current sources are used to power the test arrangement.

In addition, however, in accordance with the teachings of the present application, the sum of the weld resistance at the input end of the second driven current path and the weld resistance at the output end of the first drive current path are also determined. Here again it is noted that IA is substantially equal to IB such that IA=IB=I and the equation RW6+RW14=(V6+V14)/I. Thus, the measurements of the weld resistances are doubled by measuring two sums of two weld resistances at a time, i.e., at each index or connection of the test arrangement.

In addition, four coil resistances R1, R5, R9 and R13 can be determined by applying the equations: R1=V1/IA; R5=V5/IA; R9=V9/IB; and, R13=V13/IB after taking the appropriate voltage measurements, here too the currents should not need to be measured since current sources are used to power the test arrangement. It should be apparent that the present invention as illustrated in FIG. 3 and described above doubles the number of winding resistances and winding connection weld resistances which can be determined at a time, i.e., with a given connection to an armature, which are possible with Fisher, U.S. Pat. No. 5,140,276.

Having thus described the invention of the present application in detail and by reference to preferred embodiments thereof, it will be apparent that modifications and variations are possible without departing from the scope of the invention defined in the appended claims.

What is claimed is:

1. A method of testing an armature including a plurality of series connected windings, each of said plurality of windings being connected to a pair of commutator bars through resistive connections, said method comprising the steps of:

connecting a single source of electrical energy across first and second commutator bars to form a first driven current path through a first set of at least one winding connected between said first and second commutator bars, said first driven current path receiving current at said first commutator bar and emitting current from said second commutator bar;

connecting said single source of electrical energy across third and fourth commutator bars to form a second driven current path through a second set of at least one winding connected between said third and fourth commutator bars, said second driven current path receiving current at said third commutator bar and emitting current from said fourth commutator bar, said first and second driven current paths being connected to conduct current in opposite directions around said plurality of series connected windings and being separated from one another by at least three windings;

determining current flowing in said first driven current path;

determining current flowing in said second driven current path;

measuring voltage across at least one pair of commutator bars connected to at least one winding of said first set within said first driven current path and including said first and second commutator bars;

measuring voltage across at least one pair of commutator bars connected to at least one winding of said second set within said second driven current path and including said third and fourth commutator bars;

determining resistance of said at least one winding of said first set connected between said at least one pair of commutator bars within said first driven current path by combining in a processor the voltage measured thereacross with the current determined to be flowing in said first driven current path; and determining resistance of said at least one winding of said second set connected between said at least one pair of commutator bars within said second driven current path by combining in a processor the voltage measured thereacross with the current determined to be flowing in said second driven current path.

2. A method of testing an armature as claimed in claim 1 wherein:

said step of connecting a single source of electrical energy across first and second commutator bars to form a first driven current path through a first set of at least one winding connected between said first and second commutator bars comprises the step of connecting said single source of electrical energy across first and second commutator bars to form a first driven current path through two or more windings connected between said first and second commutator bars;

said step of connecting said single source of electrical energy across third and fourth commutator bars to form a second driven current path through a second set of at least one winding connected between said third and fourth commutator bars comprises the step of connecting said single source of electrical energy across said third and fourth commutator bars to form a second driven current path through two or more windings connected between said third and fourth commutator bars;

said step of measuring voltage across at least one pair of commutator bars connected to said at least one winding of said first set within said first driven current path comprises the step of measuring voltages across two pairs of commutator bars within said first driven current path and including said first and second commutator bars;

said step of measuring voltage across at least one pair of commutator bars connected to said at least one winding of said second set within said second driven current path comprises the step of measuring voltages across two pairs of commutator bars within said second driven current path and including said third and fourth commutator bars;

said step of determining resistance of said at least one winding of said first set connected between said at least one pair of commutator bars within said first driven current path comprises the step of determining resistances of windings connected between said two pairs of commutator bars within said first driven current path by combining in a processor the voltages measured thereacross with the current determined to be flowing in said first driven current path; and said step of determining resistance of said at least one winding of said second set connected between said at least one pair of commutator bars within said second driven current path comprises the step of determining resistances of windings connected between said two pairs of commutator bars within said second driven current path by combining in a processor the voltages measured thereacross with the current determined to be flowing in said second driven current path.

3. A method of testing an armature as claimed in claim 1 wherein said first and second driven current paths are substantially diametrically opposite to one another on said armature.

4. A method of testing an armature as claimed in claim 1 wherein said step of determining current flowing in said first driven current path comprises the steps of:

measuring current flowing into said first commutator bar;

measuring current flowing out of said second commutator bar;

measuring a first voltage across a first intermediate winding connected between an adjacent pair of commutator bars between said first commutator bar and said third commutator bar but not including either said first commutator bar or said third commutator bar;

measuring a second voltage across a second intermediate winding connected between an adjacent pair of commutator bars between said second commutator bar and said fourth commutator bar but not including either said second commutator bar or said fourth commutator bar;

calculating an estimated resistance value for said first and second intermediate windings by combining in a processor said first and second voltages with the current flowing into said first commutator bar and the current flowing out of said second commutator bar;

determining current flowing through said first intermediate winding by combining in a processor said estimated resistance value with said first voltage; and combining in a processor the current flowing into said first commutator bar with the current flowing through said first intermediate winding.

5. A method of testing an armature as claimed in claim 4 wherein said step of determining current flowing in said second driven current path comprises the steps of:

measuring current flowing into said third commutator bar; and combining in a processor the current flowing into said third commutator bar with the current flowing through said first intermediate winding.

6. A method of testing an armature as claimed in claim 5 further comprising the step of indexing the connections of said single source of electrical energy around the commutator bars of said armature to determine resistances for all of said plurality of series connected windings.

7. A method of testing an armature as claimed in claim 5 further comprising the step of measuring voltages across windings adjacent and connected to said first, second, third and fourth commutator bars but outside of said first and second driven current paths.

8. A method of testing an armature as claimed in claim 7 further comprising the steps of:

indexing the connections of said single source of electrical energy around the commutator bars of said armature to determine resistances for all of said plurality of series connected windings, currents and voltages for each of said connections of said single source of electrical energy; and combining in a processor the voltages measured across windings adjacent and connected to said first, second, third and fourth commutator bars but outside of said first and second driven current paths for each index with resistances for said windings and currents flowing during each index to determine resistances of the resistive connections of said plurality of windings to said commutator bars.

9. A method of testing an armature as claimed in claim 8 wherein said step of combining in a processor the voltages measured across windings adjacent and connected to said first, second, third and fourth commutator bars but outside of said first and second driven current paths for each index with resistances for said windings and currents flowing during each index comprises for each commutator bar the steps of:

multiplying the current flowing through an adjacent intermediate winding times the winding resistance of the winding adjacent and connected to said commutator bar but outside of the driven current path associated with said commutator bar to obtain a voltage product;

combining the voltage measured across the winding adjacent and connected to said commutator bar but outside of the driven current path associated with said commutator bar with said voltage product to obtain voltage across the resistive connection to said commutator bar; and dividing the voltage across the resistive connection to said commutator bar by the current flowing into or out of said commutator bar.

10. A method of testing an armature including a plurality of series connected windings, each of said plurality of windings being connected to a pair of commutator bars through resistive connections, said method comprising the steps of:

connecting a single source of electrical energy across first and second commutator bars to form a first driven current path through a first set of at least one winding connected between said first and second commutator bars, said first driven current path receiving current at said first commutator bar and emitting current from said second commutator bar;

connecting said single source of electrical energy across third and fourth commutator bars to form a second driven current path through a second set of at least one winding connected between said third and fourth commutator bars, said second driven current path receiving current at said third commutator bar and emitting current from said fourth commutator bar, said first and second driven current paths being connected to conduct current in opposite directions around said plurality of series connected windings and being separated from one another by at least three windings;

measuring current flowing into said third commutator bar;

measuring current flowing out of said fourth commutator bar;

measuring a first voltage across a first intermediate winding connected between an adjacent pair of commutator bars between said first commutator bar and said third commutator bar but not including either said first commutator bar or said third commutator bar;

measuring a second voltage across a second intermediate winding connected between an adjacent pair of commutator bars between said second commutator bar and said fourth commutator bar but not including either said second commutator bar or said fourth commutator bar;

calculating an estimated resistance value for said first and second intermediate windings by combining in a processor said first and second voltages with the current flowing into said third commutator bar and the current flowing out of said fourth commutator bar;

determining current flowing through said first intermediate winding by combining in a processor said estimated resistance value with said first voltage;

determining current flowing in said second driven current path by combining in a processor the current flowing into said third commutator bar with the current flowing through said first intermediate winding;

measuring current flowing into said first commutator bar;

determining current flowing in said first driven current path by combining in a processor the current flowing into said first commutator bar with the current flowing through said first intermediate winding;

measuring voltage across at least one pair of commutator bars connected to at least one winding of said first set within said first driven current path and including said first and second commutator bars;

measuring voltage across at least one pair of commutator bars connected to at least one winding of said second set within said second driven current path and including said third and fourth commutator bars;

determining resistance of at least one winding of said first set connected between said at least one pair of commutator bars within said first driven current path by combining in a processor the voltages measured thereacross with the current determined to be flowing in said first driven current path; and determining resistance of at least one winding of said second set connected between said at least one pair of commutator bars within said second driven current path by combining in a processor the voltages measured thereacross with the current determined to be flowing in said second driven current path.

11. A method of testing an armature as claimed in claim 10 wherein:

said step of connecting a single source of electrical energy across first and second commutator bars to form a first driven current path through a first set of at least one winding connected between said first and second commutator bars comprises the step of connecting said single source of electrical energy across said first and second commutator bars to form a first driven current path through two or more windings connected between said first and second commutator bars;

said step of connecting said single source of electrical energy across third and fourth commutator bars to form a second driven current path through a second set of at least one winding connected between said third and fourth commutator bars comprises the step of connecting said single source of electrical energy across said third and fourth commutator bars to form a second driven current path through two or more windings connected between said third and fourth commutator bars;

said step of measuring voltage across at least one pair of commutator bars connected to at least one winding of said first set within said first driven current path comprises the step of measuring voltages across two pairs of commutator bars connected to two windings of said first set within said first driven current path and including said first and second commutator bars;

said step of measuring voltage across at least one pair of commutator bars connected to at least one winding of said second set within said second driven current path comprises the step of measuring voltages across two pairs of commutator bars connected to two windings within said second set within said second driven current path and including said third and fourth commutator bars;

said step of determining resistance of said at least one winding of said first set connected between said at least one pair of commutator bars within said first driven current path comprises the step of determining resistances of two windings connected between said two pairs of commutator bars within said first driven current path by combining in a processor the voltages measured across said two windings with the current determined to be flowing in said first driven current path; and said step of determining resistance of said at least one winding of said second set connected between said at least one pair of commutator bars within said second driven current path comprises the step of determining resistances of two windings connected between said two pairs of commutator bars within said second driven current path by combining in a processor the voltages measured across said two windings with the current determined to be flowing in said second driven current path.

12. A method of testing an armature as claimed in claim 11 wherein said first and second driven current paths are substantially diametrically opposite to one another on said armature.

13. A method of testing an armature including a plurality of series connected windings, each of said plurality of windings being connected to a pair of commutator bars through resistive connections, said method comprising the steps of:

connecting a first source of constant current across first and second commutator bars to form a first driven current path through one or more windings connected between said first and second commutator bars, said first driven current path having a current input end and a current output end;

connecting a second source of constant current across third and fourth commutator bars to form a second driven current path through one or more windings connected between said third and fourth commutator bars, said second driven current path having a current input end and a current output end, said first and second driven current paths being connected to conduct current in opposite directions around said plurality of series connected windings and being separated from one another by at least two windings, said first and second sources of constant current being approximately equal in output current and independent of one another;

measuring a first voltage across a pair of commutator bars adjacent to the input end of said first driven current path but outside said first driven current path;

measuring a second voltage across a pair of commutator bars adjacent to the output end of said second driven current path but outside said second driven current path;

measuring a third voltage across a pair of commutator bars adjacent to the input end of said second driven current path but outside said second driven current path;

measuring a fourth voltage across a pair of commutator bars adjacent to the output end of said first driven current path but outside said first driven current path;

determining the combined resistance of the resistive connections of said first current source to said input end of said first current path and said second current source to said output end of said second current path by combining in a processor said first and second voltages; and determining the combined resistance of the resistive connections of said second current source to said input end of said second current path and said first current source to said output end of said first current path by combining in a processor said third and fourth voltages.

14. A method of testing an armature as claimed in claim 13 wherein said first and second driven current paths comprise at least a first winding adjacent said input ends and a last winding adjacent said output ends, said method further comprising the steps of:

measuring a fifth voltage across a first winding in said first driven current path;

measuring a sixth voltage across a first winding in said second driven current path;

measuring a seventh voltage across a last winding in said first driven current path;

measuring an eighth voltage across a last winding in said second driven current path;

determining resistance of said first winding in said first driven path from said fifth voltage;

determining resistance of said first winding in said second driven path from said sixth voltage;

determining resistance of said last winding in said first driven path from said seventh voltage; and determining resistance of said last winding in said second driven path from said eighth voltage.

* * * * *